United States Patent [19]

Nishihata et al.

[11] Patent Number: 5,078,851
[45] Date of Patent: Jan. 7, 1992

[54] LOW-TEMPERATURE PLASMA PROCESSOR

[76] Inventors: Kouji Nishihata, 6-37, 3-chome, Toishi, Tokuyama-shi, Yamaguchi-Ken; Shigekazu Kato, 12-4, 3-chome, Toyo, Kudamatsu-Shi, Yamaaguchi-Ken; Atsushi Itou, 499-3, Ikunoya, Kudamatsu-Shi, Yamaguchi-Ken; Tsunehiko Tsubone, 1611-10, Nishitoyoi, Kudamatsu-Shi, Yamaguchi-Ken; Naoyuki Tamura, 1117, Kasadojima, Kudamatsu-Shi, Yamaguchi-Ken, all of Japan

[21] Appl. No.: 556,449
[22] Filed: Jul. 24, 1990

[30] Foreign Application Priority Data

Jul. 26, 1989 [JP] Japan .................................. 1-191474

[51] Int. Cl.⁵ ................................................. C23F 1/02
[52] U.S. Cl. ............................ 204/298.34; 204/298.31; 204/298.38; 156/345
[58] Field of Search ........................ 204/298.09, 298.15, 204/298.31, 298.34, 298.38; 156/345

[56] References Cited

U.S. PATENT DOCUMENTS

| | | | |
|---|---|---|---|
| 4,399,016 | 8/1983 | Tsukada et al. | 204/298.31 X |
| 4,434,042 | 2/1984 | Keith | 204/298.09 |
| 4,448,652 | 5/1984 | Pachonik | 204/298.09 |
| 4,705,595 | 11/1987 | Okudaira et al. | 204/298.34 X |
| 4,771,730 | 9/1988 | Tezuka | 204/298.09 X |
| 4,832,781 | 5/1989 | Mears | 204/298.09 X |
| 4,844,767 | 7/1989 | Okudaira et al. | 204/298.34 X |
| 4,897,171 | 1/1990 | Ohmi | 204/298.15 |
| 4,911,812 | 3/1990 | Kudo et al. | 156/345 X |
| 4,956,043 | 9/1990 | Kanetomo et al. | 204/298.09 X |

Primary Examiner—Nam X. Nguyen
Attorney, Agent, or Firm—Antonelli, Terry, Stout & Kraus

[57] ABSTRACT

The present invention relates to a plasma processor in which a sample such as semiconductor substrate is processed with a plasma under a cooled state. An electric insulator is interposed between a sample holder for arranging the sample thereon and a cooling container for cooling the sample holder, so as to electrically insulate them, whereby a bias voltage applied to the sample holder and a voltage for generating the plasma can be prevented from leaking, so as to stabilize the process. In addition, the insulator is held in close contact with the sample holder and the cooling container through members of a thermal conductor, whereby the occurrence of non-uniformity during the processing of the sample and the occurrence of a dispersion in the qualities of processed samples among sample lots or among processors can be suppressed.

8 Claims, 3 Drawing Sheets

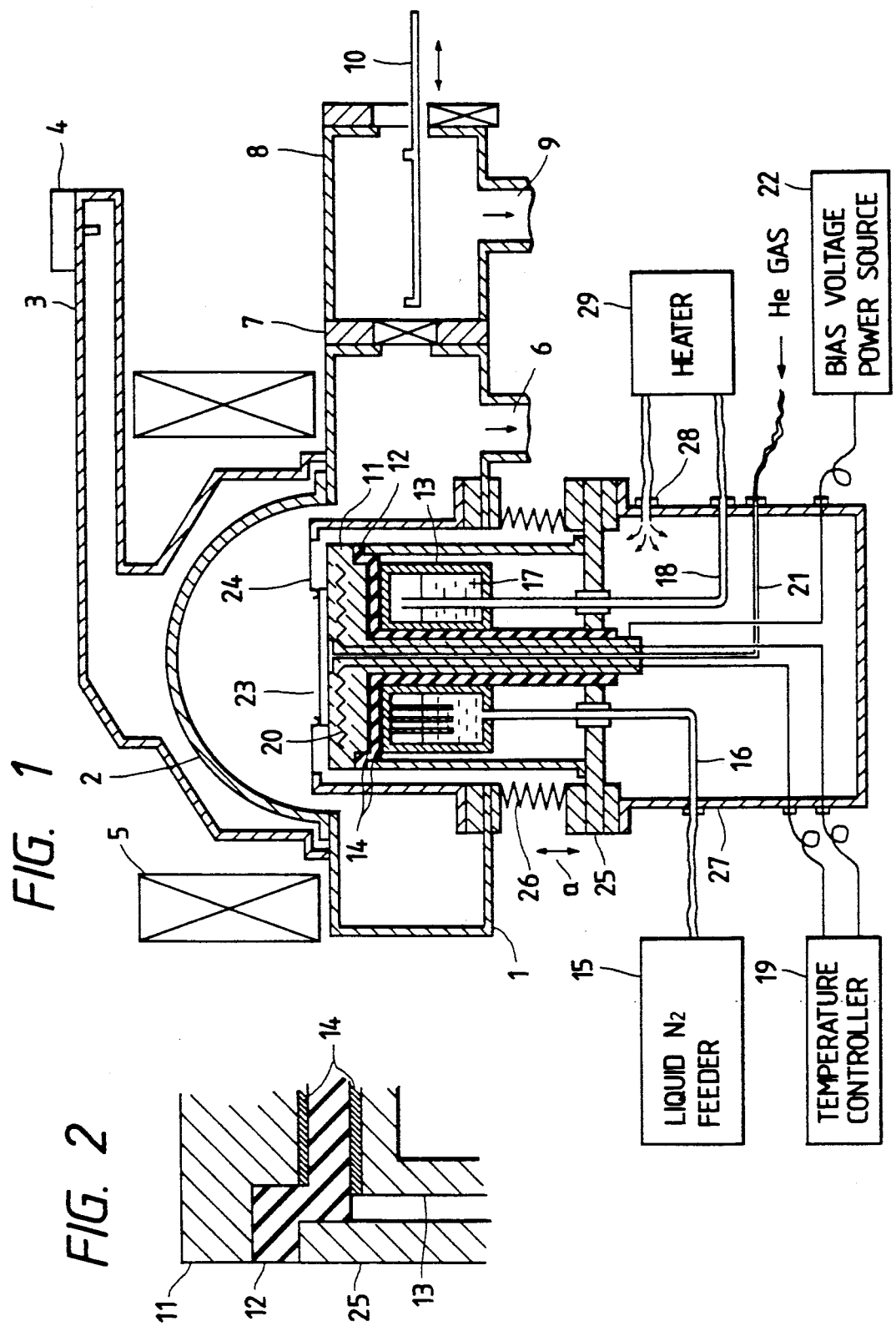

LOW-TEMPERATURE PLASMA PROCESSOR

BACKGROUND OF THE INVENTION

1. Field of the Invention

The present invention relates to plasma processors, and more particularly to a plasma processor which is well suited to process a sample, such as a semiconductor substrate, with a plasma under a cooled state.

1. Description of the Prior Art

As techniques for processing a sample, such as a semiconductor substrate, with a plasma under a cooled state, there have heretofore been known ones as disclosed in, for example, the official gazettes of Japanese Patent Applications Laid-open No. 72877/1988, No. 110726/1988 and No. 174322/1988.

Disclosed in the official gazette of Japanese Patent Application Laid-open No. 72877/1988 is the technique wherein a sample holder which is cooled with cooling water is disposed in a vacuum vessel, an electrode for an electrostatic chuck coated with a dielectric film is mounted on the sample holder, the object to-be-processed is electrostatically fixed to the electrode for the electrostatic chuck by applying a DC voltage to this electrode, and the rear surface of the fixed object to-be-processed is fed with a cooling gas from a cooling gas conduit which is connected penetrating the electrode for the electrostatic chuck, whereby the efficiency of cooling the object to-be-processed is heightened for the plasma process. In this case, the plasma is generated in such a way that an RF (radio-frequency) voltage is applied between the sample holder and an electrode opposing thereto by an RF power source which is connected to the sample holder.

Each of the official gazettes of Japanese Patent Applications Laid-open No. 110726/1988 and No. 174322/1988 discloses the technique wherein a sample holder which is cooled by a coolant is arranged in a processing chamber, and a heating element is provided in the sample holder, whereby the temperature of the sample placed on the sample holder is controlled for the plasma process by the heating element and the coolant. In this case, the plasma is generated in such a way that an RF voltage is applied between the sample holder and an electrode opposing thereto by an RF power source which is connected to the sample holder. Alternatively, it is generated with a microwave. Regarding the method which generates the plasma with the microwave, the sample is sometimes subjected to the plasma process by connecting an RF power source to the sample holder and inducing a bias voltage in this sample holder.

The prior-art techniques mentioned above (in the official gazettes of Japanese Patent Applications Laid-open No. 72877/1988, No. 110726/1988 and No. 174322/1988) have not taken it into consideration that the coolant to be used and the materials of a pipe for feeding the coolant, are altered depending upon the temperature regions of cooling. More specifically, in these prior-art techniques, it is common practice that a bias voltage based on RF power or the like is applied to the sample holder in the plasma process, herein, etching process of the sample. However, in such a case where the sort of the coolant has changed or where the cooling temperature is low, a metal pipe being electrically conductive is sometimes used as the pipe for feeding the coolant, and the RF power might leak from the metal pipe. Moreover, in the case of the change of the sort of the coolant the RF power might leak through the coolant because electrical characteristics differ depending upon coolants.

The former prior-art technique (in the official gazette of Japanese Patent Application Laid-open No. 72877/1988) has not considered the efficiency of the conduction of heat in the case where the heat of cooling from the sample holder cooled by the cooling water is transmitted to the sample to-be-processed fixed to the electrode for the electrostatic chuck, through the electrostatic chuck electrode coated with the dielectric film. More specifically, the technique has the problem that the interposition of the electrostatic chuck electrode between the sample holder and the sample to-be-processed gives rise to microscopic gaps between the sample holder and the electrostatic chuck electrode, so the heat of cooling is not effectively transmitted from the sample holder to the electrostatic chuck electrode. This is ascribable to the fact that, as the cooling temperature lowers, heat transfer cannot be expected of radiation heat and cannot help being resorted to conduction heat. The problem is serious especially in an apparatus wherein the sample is processed by cooling the sample holder to a temperature below the freezing temperature of water (below 0° C.). Further, a microscopic gap exists in the contact surface between the sample holder and the electrostatic chuck electrode, and it does not become substantially uniform, so that the thermal conductivity of the whole surface varies. In addition, the states of the contact surfaces differ due to discrepancies involved in the apparatuses, so that the individual apparatuses exhibit unequal thermal conductivities. This leads to the problem that the temperatures of the samples during the plasma processes become non-uniform to incur a dispersion in the qualities of the processed samples, for example, wafers among the processes, lots or processors of these wafers. In the case where the samples are cooled to the temperature below the freezing temperature of water and then processed with the plasma, the chemical reactions between the samples and radical species in the plasma are prone to depend upon temperatures. Therefore, when the temperatures of the samples become non-uniform as stated above, the non-uniform processes appear drastically.

SUMMARY OF THE INVENTION

The first object of the present invention is to provide a plasma processor in which a bias voltage applied to a sample holder or a voltage for generating a plasma can be prevented from leaking, thereby to carry out a stable process.

The second object of the present invention is to provide a plasma processor which can suppress the occurrence of non-uniformity during the process of a sample and the occurrence of a dispersion in the qualities of processed samples among sample lots or among processors.

In a plasma processor having generation means for generating a plasma, a member which holds a sample to be processed with the plasma, by itself or includes a sample holding section and to which a voltage inducing a bias voltage is applied, and a cooling member which cools the member with the voltage applied thereto; the present invention consists in that an electric insulator is interposed between said cooling member and said member with the voltage applied thereto, whereby the bias voltage applied to the sample holder or the voltage for generating the plasma can be prevented from leaking, thereby to carry out a stable process.

Also, in a plasma processor having generation means for generating a plasma, a member which holds a sample to be processed with the plasma, by itself or includes a sample holding section and to which a voltage inducing a bias voltage is applied, and a cooling member which cools the member with the voltage applied thereto; the present invention consists in that an electric insulator is interposed between said cooling member and said member with the voltage applied thereto, and that said electric insulator is held in close contact with said cooling member and said member with the voltage applied thereto, through members of a thermal conductor, whereby the occurrence of non-uniformity in the process of the sample and the occurrence of a dispersion in the qualities of the processed samples among sample lots or among processors can be suppressed.

BRIEF DESCRIPTION OF THE DRAWINGS

FIG. 1 is a vertical sectional view showing a plasma processor which is an embodiment of the present invention;

FIG. 2 is a partial detailed view of a sample holder and associated portions in FIG. 1;

DESCRIPTION OF THE PREFERRED EMBODIMENTS

Figure 3:
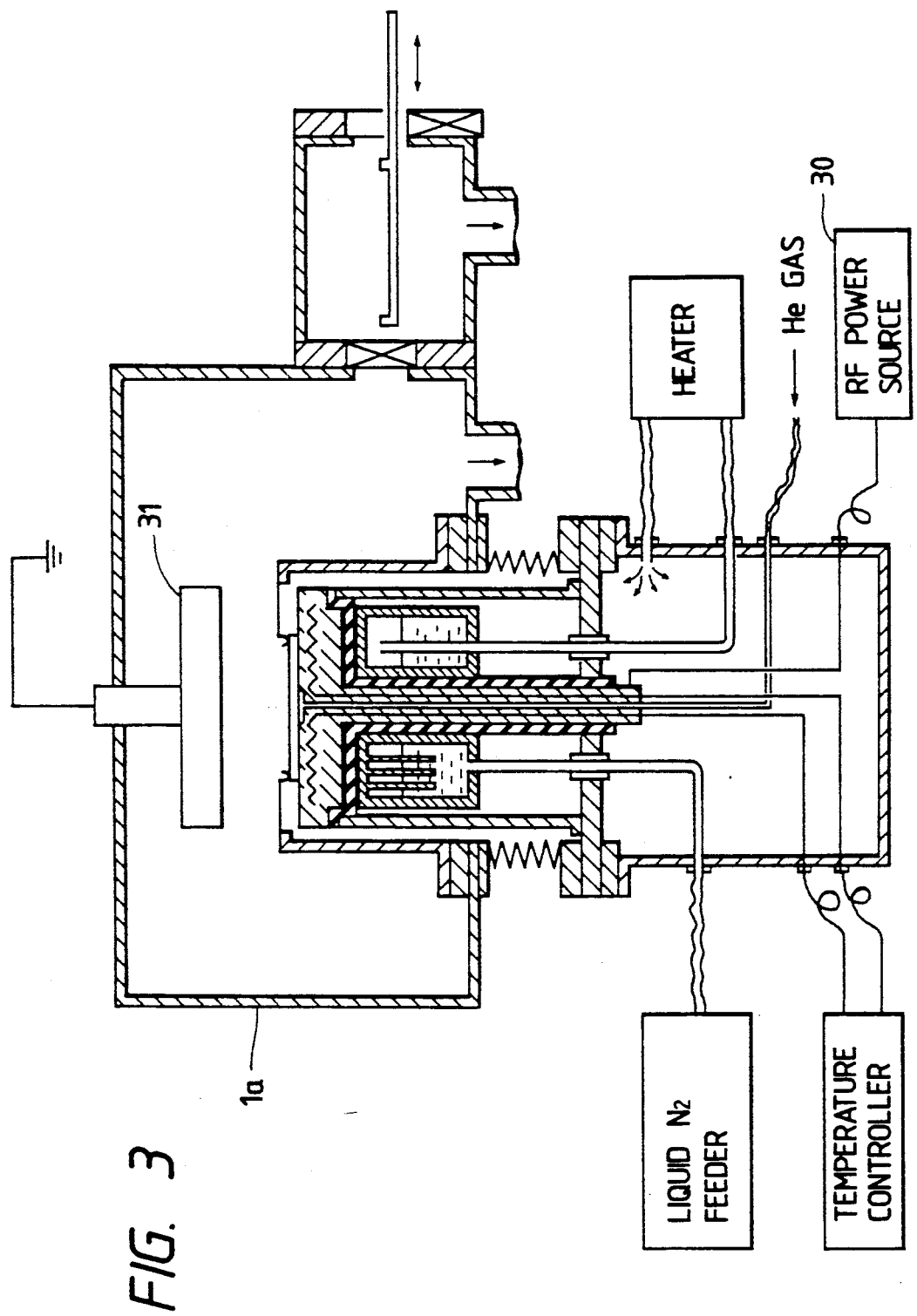
FIG. 3 is a vertical sectional view showing a plasma processor which is the second embodiment of the present invention.

Now, one embodiment of the present invention will be described with reference to FIGS. 1 and 2.

FIG. 1 shows a constructional view of a plasma processor. Here will be described a case where the low-temperature plasma processor is applied to a microwave etching equipment with a magnetic field by way of example.

A processing chamber 1 is adjoined by a sub vacuum chamber 8 through a gate valve 7. The sub vacuum chamber 8 has a leakage unit (not shown) connected thereto, and has a vacuum pump unit (not shown) connected thereto through an exhaust port 9. It is provided with a conveyance arm 10 which can advance into the processing chamber 1 through the gate valve 7. On the top of the processing chamber 1, a discharge tube 2 which is made of quartz herein is mounted to form a plasma processing chamber. The processing chamber 1 has a gas feeder (not shown) connected thereto, which is capable of feeding a plasma processing gas, in this case an etching gas, into the plasma processing chamber. Also, the processing chamber 1 has a vacuum pump unit (not shown) connected thereto, which is capable of evacuating the plasma processing chamber through an exhaust port 6 so as to reduce the internal pressure of this plasma processing chamber to a predetermined value.

A waveguide 3 is disposed outside the discharge tube 2 in a manner to surround this discharge tube, and it is surrounded with a solenoid coil 5 for generating the magnetic field within the discharge tube 2. A magnetron 4 for generating a microwave is mounted on an end part of the waveguide 3.

Attached to the bottom of the processing chamber 1 through bellows 26 is a supporting bedplate 25 which is movable in the directions of double-headed arrow a, in this case, in the vertical directions. The bellows 26 and the supporting bedplate 25 seal the interior of the processing chamber 1 hermetically. The supporting bedplate 25 is furnished with a sample holder 11 on which a wafer 23 being a sample to-be-processed can be arranged. The sample holder 11 is mounted on the supporting bedplate 25 through an electric insulator 12, and the lower part thereof is extended, penetrating the supporting bedplate 25. The electric insulator 12 electrically insulates the supporting bedplate 25 from an RF (radio-frequency) power source 22. In addition, a wafer keeper 24 is connected to the bottom of the processing chamber 1 so as to correspond to the upper surface of the sample holder 11 mounted on the supporting bedplate 25. The wafer keeper 24 is arranged so that the periphery of the wafer 23 placed on the sample holder 11 may be pressed down at several positions when the supporting bedplate 25 has been lifted to raise the sample holder 11.

The RF power source 22 which is bias application means is connected to the sample holder 11. Besides, a heat transmission gas feeder (not shown) for feeding the rear surface of the wafer 23 with a heat transmission gas, herein He gas, for cooling this wafer is connected to the sample holder 11 through a feed pipe 21. Further, the sample holder 11 is internally provided with a heating element 20, to which a temperature controller 19 is connected. The temperature controller 19 controls the heating element 20 in accordance with a signal sent from a temperature sensor (not shown) which measures the temperature of the wafer 23.

In this embodiment, a cooling container 13 for cooling the sample holder 11 is disposed on the rear surface side of this sample holder with the electric insulator 12 intervening therebetween. Here, the electric insulator 12 serves to electrically insulate the cooling container 13 from the RF power source 22. Incidentally, a material of high thermal conductivity is suitable as the electric insulator 12 on this occasion. By way of example, any of boron nitride (BN), ceramics (such as alumina, silicon nitride, and aluminum nitride (AlN)) and the like may be selected. Besides, although the electric insulator 12 is applied even to the shaft portion of the sample holder 11 in the illustrated case, this shaft portion need not be cooled. Therefore, the electric insulator 12 may be an insulating collar which merely serves for the electrical insulation and which can be formed of, for example, a fluorocarbon resin.

As shown in detail in FIG. 2, members of a thermal conductor 14 are respectively interposed, in close contact in this case, between the sample holder 11 and the electric insulator 12 and between the electric insulator 12 and the cooling container 13. The thermal conductor members 14 serve to improve the property of heat transfer from the cooling container 13 to the sample holder 11, and to render the conduction of heat uniform. As the first method of bringing the thermal conductor 14 into close contact, a soft material such as indium is employed, and it is pressed and conformed to the ruggedness of the contact surface of the sample holder 11, electric insulator 12 or cooling container 13, thereby to be brought into close contact. On this occasion, when the soft material is heated to near its melting point, it exhibits a still closer adhesion. The material indium need not always be heated, and the pressing method may well be a simple one such as locking with bolts. The soft materials suited to the thermal conductor members 14 include, for example, lead, zinc, solder and a brazing mixture, in addition to the aforementioned material indium. As the second method of bringing the thermal conductor 14 into close contact, the electric insulator 12 is metallized, and the thermal conductor members 14 made of a solder are used as brazing members so as to unite the sample holder 11, electric insulator 12 and cooling container 13. On this occasion, by way of example, alumina may be employed for a metallic film for the metallization, and silver solder (a eutectic alloy consisting of 72% of Ag and 28% of Cu) as the brazing material.

By bringing the thermal conductor 14 into close contact in this way, the property of heat transfer at each contact surface and uniformity in the conduction of heat within each contact surface are enhanced, whereby the heat of cooling is efficiently and uniformly transmitted from the cooling container 13 to the sample holder 11. By the way, in the case where the sample holder 11, electric insulator 12 and cooling container 13 are brought into the unitary construction by metallizing the electric insulator 12 and employing the solder as the brazing members, the close adhesion is further improved, and the property of heat transfer and the uniform conduction of heat are enhanced.

The cooling container 13 is filled with a liquid coolant which is liquid nitrogen 17 in the illustrated case. A feed pipe 16 for feeding the liquid coolant, and a discharge pipe 18 for discharging the gas of the coolant are connected to the cooling container 13. The feed pipe 16 is joined to a liquid $N_2$ feeder 15 in this case.

A case 27 is attached to the lower surface of the supporting bedplate 25. The case 27 is disposed so as to cover, e.g., those parts of the sample holder 11, feed pipe 16 and discharge pipe 18 which underlie the lower surface of the supporting bedplate 25. This case 27 is provided with a feed port 28 which is capable of feeding a purge gas. In the illustrated case, the discharge pipe 18 is joined to the feed port 28 through a heater 29. The interior of the case 27 is fed through the feed port 28 with the purging gas which is, herein, the nitrogen gas discharged from the discharge pipe 18 as heated to the normal temperature.

The microwave etching equipment with a magnetic field constructed as described above operates as follows:

First, the wafer 23 is carried from within the atmospheric air into the sub vacuum chamber 8 by the conveyance arm 10. The wafer 23 within the sub vacuum chamber 8 is sent into the processing chamber 1 by a transportation device, not shown, in the state in which the supporting bedplate 25 has descended, that is, in which the sample holder 11 has descended. The wafer 23 sent into the processing chamber 1 is further delivered to a wafer transfer device, not shown, and arranged on the top surface of the sample holder 11.

After the wafer 23 has been arranged on the top surface of the sample holder 11, the supporting bedplate 25 is lifted to raise the sample holder 11. Thus, the wafer 23 on the top surface of the sample holder 11 is fixed to this top surface by the wafer keeper 24. Thereafter, the He gas is fed to the rear surface of the wafer 23 through the feed pipe 21. Thus, the He gas being the heat transmission gas comes to exist in the minute gap between the wafer 23 and the sample holder 11.

On this occasion, the liquid nitrogen has already been supplied from the liquid $N_2$ feeder 15 into the cooling container 13 through the feed pipe 16. Thus, the cooling container 13 is cooled down to the liquid nitrogen temperature. The heat of cooling of the cooling container 13 at the liquid nitrogen temperature is uniformly transmitted from this cooling container 13 to the electric insulator 12 through one of the thermal conductor members 14, and it is uniformly transmitted from the electric insulator 12 to the sample holder 11 through the other thermal conductor member 14. Further, it is uniformly transmitted to the wafer 23 through the heat transmission gas which intervenes between the sample holder 11 and the wafer 23 fixed thereto. Thus, the wafer 23 is cooled uniformly over its whole area.

Besides, the temperature of the wafer 23 is measured by the temperature sensor, not shown. The heating element 20 is controlled by the temperature controller 19 in accordance with the measured temperature, thereby to adjust the temperature of the sample holder 11 so that the wafer 23 may become a predetermined temperature, namely, a temperature suitable for the anisotropic etching process of a desired material.

On the other hand, the liquid nitrogen vaporized in the cooling container 13 turns into nitrogen gas of low temperature, which is discharged through the discharge pipe 18. The discharged low-temperature nitrogen gas is heated to the normal temperature by the heater 29, and is introduced from the feed port 28 into the case 27 so as to function as the purge gas. The purge gas in the case 27 leaks into the atmospheric air through the gaps of this case 27. Thus, dew condensation is prevented at the low-temperature portions which protrude below the lower surface of the supporting bedplate 25.

Under the set conditions thus far described, the etching gas is supplied from the gas feeder, not shown, into the processing chamber 1, and the interior of the processing chamber 1 is evacuated to a predetermined reduced pressure by the vacuum pump unit, not shown. Subsequently, the microwave is oscillated by the magnetron 4, and the magnetic field is generated by the solenoid coil 5. Then, the microwave enters the discharge tube 2 through the waveguide 3, and the magnetic field of the solenoid coil 5 develops in the discharge tube 2, so that the plasma is generated in the discharge tube 2 by the interaction between the electric field of the microwave and the magnetic field of the solenoid coil 5. Further, the RF power is applied to the sample holder 11 by the RF power source 22. Thus, the bias voltage is generated on the upper surface of the wafer 23, and reactive ions in the plasma are drawn to the side of the wafer 23, whereby the anisotropic etching process proceeds. Etching based on the chemical reactions of the wafer 23 with radical species contained in the plasma, in other words, isotropic etching becomes difficult to arise on the ground that the chemical reactions between the radical species and the material to-be-etched are suppressed because the wafer 23 is cooled to the low temperature by the heat of cooling of the liquid nitrogen.

Since, on this occasion, the cooling container 13 is electrically insulated from the bias voltage by the electric insulator 12, this bias voltage can be prevented from leaking through the liquid coolant 17, feed pipe 16 and discharge pipe 18, and the application thereof to the sample holder 11 can be kept stable. Thus, the wafer 23 can be etched and processed stably and favorably. Moreover, since the liquid $N_2$ feeder 15 need not be specially insulated, the measure for insulation can be simplified.

Since the sample holder 11 is thermally connected with the cooling container 13 through the thermal conductor members 14, the wafer 23 is uniformly cooled. Thus, the reactions of the radicals during the etching process of the wafer 23 are suppressed uniformly over the whole area of the wafer 23. This can greatly contribute to a homogenous process, and can eliminate a dispersion among the processors to enhance the qualities of all the processed articles.

According to this embodiment thus far described, the sample holder and the cooling container are electrically insulated. Therefore, the embodiment brings forth the effect that the stable bias voltage can be applied to the sample holder, so the sample can be etched and processed stably and favorably.

Moreover, the gap between the electric insulator and the cooling container and the gap between the electric insulator and the sample holder can be virtually eliminated. Therefore, the embodiment brings forth the effect that the transfer of heat can be made uniform over the whole area of the sample holder, to enhance the uniformity in the process of the sample and to relieve the dispersions of the qualities of the processed samples among the sample lots and among the processors. Another effect is that the sample can be efficiently cooled.

Now, the second embodiment of the present invention will be described with reference to FIG. 3.

In the figure, the same constituents as in FIG. 1 shall have their symbols omitted and shall not be repeatedly explained. The points of difference of this embodiment from the first embodiment in FIGS. 1 and 2 are that an electrode 31 is provided in opposition to a sample holder 11 within a processing chamber 1a, and that an RF power source 30 is connected to the sample holder 11. The electrode 31 is grounded.

According to the plasma processor, herein, a parallel plate type etching processor thus constructed, RF power is applied between the sample holder 11 and the electrode 31 by the RF power source 30, a processing gas introduced into the processing chamber 1a is turned into a plasma between them, and a sample cooled on the sample holder 11 is subjected to a plasma process. Also in this case, a bias voltage is generated by the RF power source 30, and the etching process proceeds as in the first embodiment.

The second embodiment thus far described brings forth effects similar to those of the foregoing embodiment.

Now, the third embodiment of the present invention will be described with reference to FIG. 4.

Figure 4:
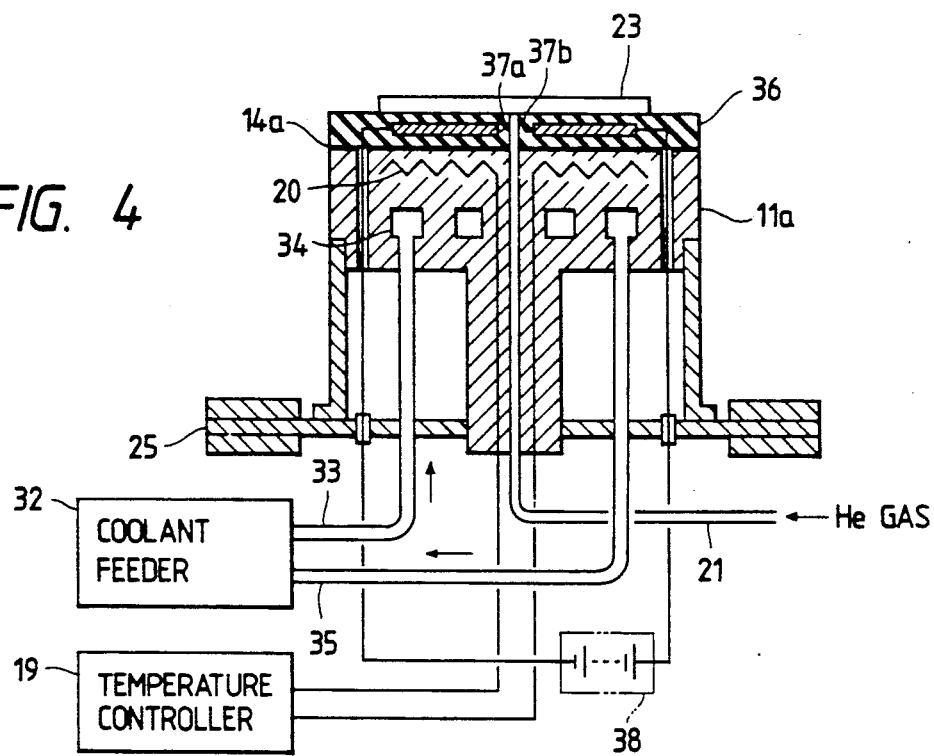
FIG. 4 is a vertical sectional view of a sample holder and associated portions showing a plasma processor which is the third embodiment of the present invention.

FIG. 4 shows a sample holder and associated portions, and constituents not shown in the figure can be constructed as in FIGS. 1 and 3. In FIG. 4, the same symbols as in FIG. 1 indicate the same portions, which shall not be repeatedly explained. The points of difference of the illustrated portions from the sample holder 11 and associated portions in FIG. 1 are that a coolant for cooling the sample holder 11a is of the circulation type, and that a wafer 23 is held on the sample holder 11a by an electrostatic attraction or suction device of the bipolar type (having both positive and negative electrodes). The sample holder 11a in this case is of the type having neither a bias voltage power source nor an RF power source connected thereto, and it is directly provided with a coolant circulation slot 34. A coolant feeder 32 is connected to the coolant circulation slot 34 through a feed pipe 33 and a return pipe 35. An electric insulator 36 being a dielectric is mounted on the top surface of the sample holder 11a while embracing the electrodes 37a and 37b for electrostatic suction. A DC power source 38 is connected between the electrodes 37a and 37b. A thermal conductor 14a as described in the first embodiment is interposed between the electric insulator 36 and the sample holder 11a so as to bring them into close contact.

According to the sample holder 11a thus constructed, the wafer 23 is held on the sample holder 11a by the electrostatic suction, and He gas is supplied to the rear surface of the wafer 23 through a feed pipe 21. Thus, the heat of cooling of the sample holder 11a cooled by the coolant circulated from the coolant feeder 32 is uniformly transmitted to the wafer 23 through the thermal conductor member 14a, the electric insulator 36, the electrodes 37a and 37b, and the He gas.

The third embodiment described above can transfer heat uniformly over the whole area of the sample holder and cool the sample efficiently in the same manner as in the first embodiment, and it therefore brings forth similar effects.

Now, the fourth embodiment of the present invention will be described with reference to FIG. 5.

Figure 5:
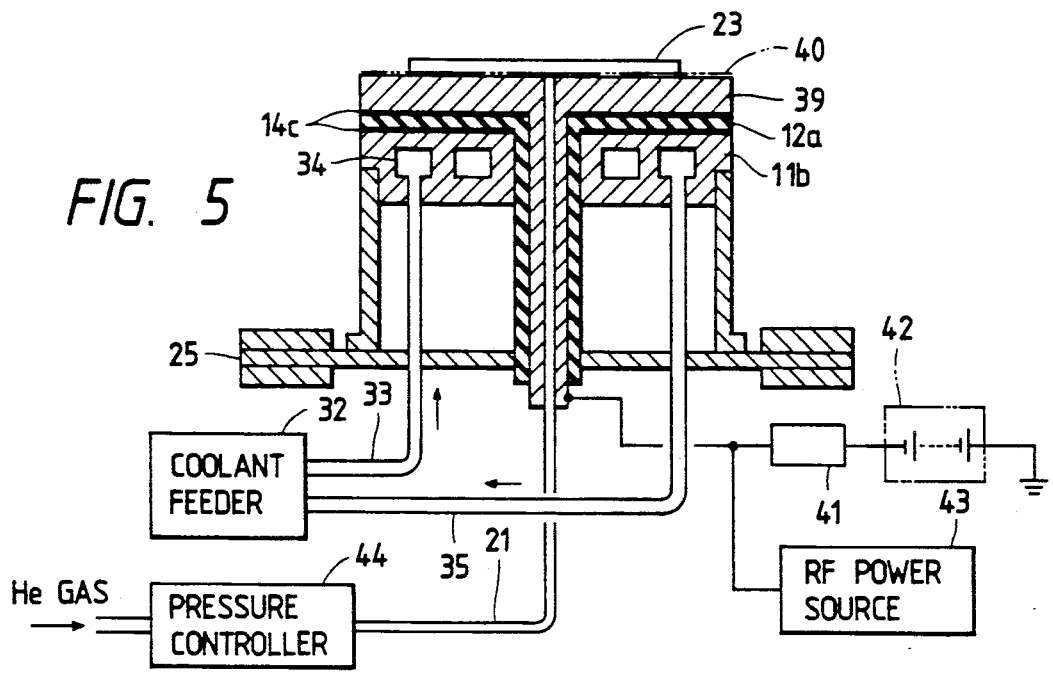
FIG. 5 is a vertical sectional view of a sample holder and associated portions showing a plasma processor which is the fourth embodiment of the present invention.

FIG. 5 shows a sample holder and associated portions. In the figure, the same constituents as in FIG. 4 are indicated by the same symbols, and they shall not be repeatedly explained. The points of difference of this embodiment from the third embodiment in FIG. 4 are that an electrostatic suction circuit is formed through a plasma, and that the temperature of a wafer 23 is controlled by adjusting the pressure of He gas which is supplied to the rear surface of the wafer 23. The sample holder 11b in this case is overlaid with an electrode 39 through an electric insulator 12a, and the upper surface of the electrode 39 is formed with a dielectric film 40 by, for example, alumina coating. Members of a thermal conductor 14c are respectively interposed between the sample holder 11b and the electric insulator 12a and between the electric insulator 12a and the electrode 39 so as to bring them into close contact. An RF power source 43 is connected to the electrode 39, and a DC power source 42 for forming the DC circuit through the plasma is also connected to the electrode 39 through an RF blocking element 41. The RF power source 43 included here is used as means for applying a bias voltage, in the case where the plasma is generated by utilizing the microwave as in the embodiment shown in FIG. 1, while it is used as means for generating the plasma, in the case where the plasma is generated by the parallel plate system as in FIG. 2. A feed pipe 21 is supplied with the He gas whose pressure has been adjusted by a pressure controller 44.

According to the sample holder 11b thus constructed, the wafer 23 is held on the sample holder 11b by the electrostatic suction, and the He gas is supplied to the rear surface of the wafer 23 through the feed pipe 21. Thus, the heat of cooling of the sample holder 11b cooled by a coolant circulated from a coolant feeder 32 is uniformly transmitted to the wafer 23 through one of the thermal conductor members 14c, the electric insulator 12a, the other thermal conductor member 14c, the electrode 39, the dielectric film 40, and the He gas. Moreover, the He gas whose pressure has been adjusted by the pressure controller 44 is supplied to the rear surface of the wafer 23. Thus, the heat transfer rate of the He gas can be changed to vary the temperature of the wafer 23.

The fourth embodiment described above can transfer heat uniformly over the whole area of the sample holder and cool the sample efficiently in the same manner as in the third embodiment, and it therefore brings forth similar effects. Moreover, since the fourth embodiment electrically insulates the sample holder and the electrode, it brings forth the effect that the plasma generating voltage or the bias voltage can be stably applied to the electrode, so the sample can be etched and processed stably and favorably.

According to the present invention, there is produced the effect that a bias voltage applied to a sample holder or a voltage for generating a plasma is prevented from leaking, so a stable process can be carried out. As another effect, it is possible to suppress the occurrence of non-uniformity during the processing of a sample and the occurrence of dispersions in the qualities of processed samples among sample lots and among processors. Still another effect is that the sample can be efficiently cooled.

By the way, although the present invention has been described as to the processor of the type cooling the sample holder with a coolant, it is similarly effective even when applied to a processor of the type cooling a sample holder directly by means of a refrigerator.

In addition, the sample holder of the electrostatic suction type illustrated in the third embodiment may well be combined with the measure which makes it possible to apply the voltage to the sample holder by the use of the electric insulator 12 as in the first embodiment.

What is claimed is:

1. A plasma processor comprising:
    generation means for generating a plasma;
    a member for holding a sample to be processed with the plasma, alone or in cooperation with a sample holding section, and to which a voltage for drawing ions in the plasma toward the sample is applied;
    a cooling member for cooling said member with the voltage applied thereto, said cooling member being separated from said member with the voltage applied thereto; and
    an electric insulator which is interposed between said cooling member and said member with the voltage applied thereto.

2. A plasma processor as defined in claim 1, wherein said member to which the voltage is applied has a radio-frequency power source connected thereto.

3. A plasma processor as defined in claim 1, wherein said sample holding section is an electrostatic suction device.

4. A plasma processor as defined in claim 1, wherein said electric insulator is made of a material selected from the group consisting of ceramics and boron nitride.

5. A plasma processor as defined in claim 1, wherein said electric insulator closely contacts said cooling member and said member with the voltage applied thereto through thermal conductor members.

6. A plasma processor as defined in claim 5, wherein said thermal conductor members are made of a material selected from the group consisting of indium, lead, zinc, solder, and a brazing mixture.

7. A plasma processor comprising:
    generation means for generating a plasma;
    a member to which a voltage for drawing ions in the plasma toward a sample to be processed is applied;
    a cooling member for cooling said member with the voltage applied thereto, said cooling member being separated from said member with the voltage applied thereto;
    means for holding the sample to be processed with the plasma on said member with the voltage applied thereto by electrostatic suction; and
    an electric insulator which is interposed between said cooling member and said member with the voltage applied thereto.

8. A plasma processor as defined in claim 7, wherein an electrode member of said means for holding a sample by electrostatic suction is said member with the voltage applied thereto.

* * * * *